United States Patent
Koshiba et al.

(10) Patent No.: US 8,907,346 B2
(45) Date of Patent: Dec. 9, 2014

(54) IMPRINT APPARATUS, IMPRINT METHOD, AND MANUFACTURING METHOD OF SEMICONDUCTOR DEVICE

(71) Applicant: Kabushiki Kaisha Toshiba, Tokyo (JP)

(72) Inventors: Takeshi Koshiba, Mie (JP); Nobuhiro Komine, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 13/739,259

(22) Filed: Jan. 11, 2013

(65) Prior Publication Data

US 2014/0065735 A1    Mar. 6, 2014

(30) Foreign Application Priority Data

Sep. 4, 2012   (JP) ................ 2012-194544

(51) Int. Cl.
    *H01L 29/38*   (2006.01)
    *H01L 21/66*   (2006.01)
    *G03F 7/00*    (2006.01)

(52) U.S. Cl.
    CPC .............. *H01L 22/10* (2013.01); *G03F 7/0002* (2013.01)
    USPC ....................................................... 257/64

(58) Field of Classification Search
    USPC ....................................................... 257/64
    See application file for complete search history.

(56) References Cited

U.S. PATENT DOCUMENTS

| | | | |
|---|---|---|---|
| 2010/0187714 A1* | 7/2010 | Kobiki et al. ............... | 264/135 |
| 2010/0308485 A1* | 12/2010 | Inanami et al. ............. | 264/40.1 |
| 2011/0143271 A1* | 6/2011 | Koshiba et al. ............. | 430/30 |
| 2011/0309548 A1 | 12/2011 | Aihara | |
| 2012/0028378 A1 | 2/2012 | Morinaga et al. | |
| 2012/0050441 A1 | 3/2012 | Mikami et al. | |
| 2012/0072003 A1 | 3/2012 | Matsuoka et al. | |
| 2012/0075368 A1 | 3/2012 | Mikami et al. | |
| 2012/0208327 A1* | 8/2012 | Matsuoka ................... | 438/127 |
| 2012/0311511 A1* | 12/2012 | Taguchi et al. ............. | 716/52 |

FOREIGN PATENT DOCUMENTS

| | | |
|---|---|---|
| EP | 1 072 954 A2 | 1/2001 |
| JP | 2000-194142 | 7/2000 |
| JP | 2001-68411 | 3/2001 |
| JP | 2007-296783 | 11/2007 |
| JP | 2011-222705 | 11/2011 |
| JP | 2012-4354 | 1/2012 |
| JP | 2012-33769 | 2/2012 |
| JP | 2012-54322 | 3/2012 |
| JP | 2012-69701 | 4/2012 |
| JP | 2012-69758 | 4/2012 |

* cited by examiner

*Primary Examiner* — Alexander Ghyka
*Assistant Examiner* — Stanetta Isaac
(74) *Attorney, Agent, or Firm* — Oblon, Spivak, McClelland, Maier & Neustadt, L.L.P.

(57) ABSTRACT

An imprint apparatus according to embodiments includes a stage, a dropping unit that drops resist, an imprinting unit that presses a circuit pattern of a template against the resist on a transfer target substrate, an underlying position detecting unit, a correcting unit, and a dropping position control unit. The underlying position detecting unit detects a position of an underlying pattern on the transfer target substrate. The correcting unit corrects a dropping position of the resist on a basis of a position of the underlying pattern. The dropping position control unit causes the resist to be dropped onto a dropping position after correction on the transfer target substrate on the basis of corrected dropping position.

15 Claims, 8 Drawing Sheets

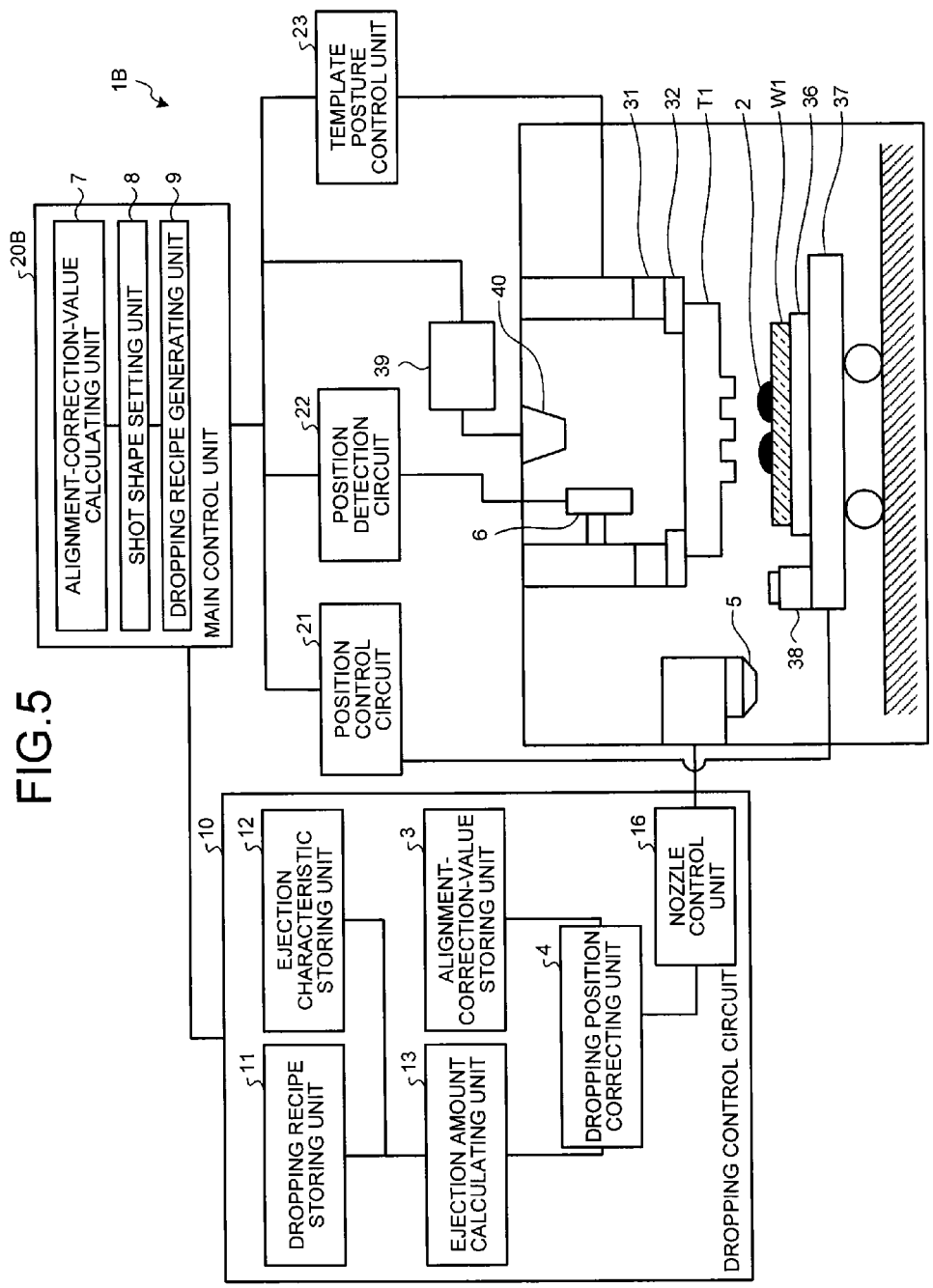

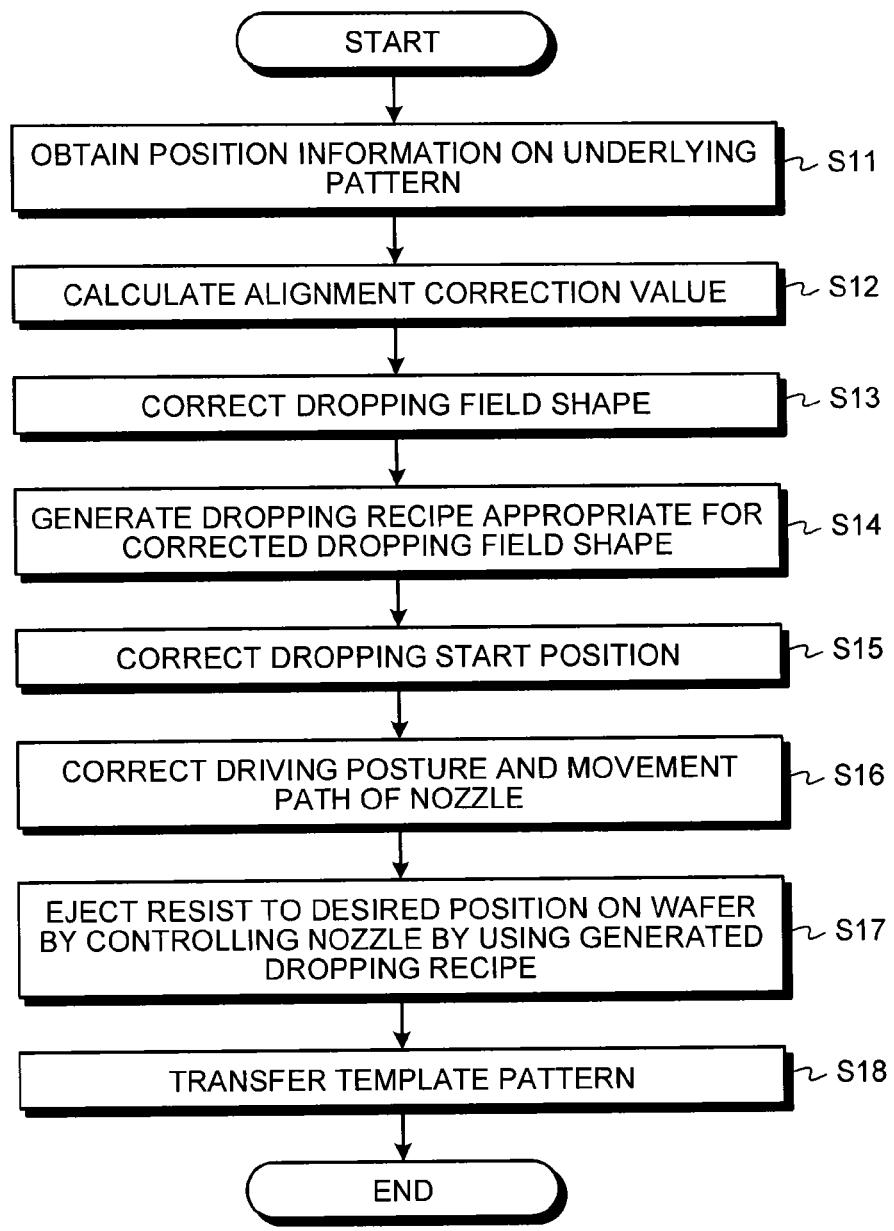

IMPRINT APPARATUS, IMPRINT METHOD, AND MANUFACTURING METHOD OF SEMICONDUCTOR DEVICE

CROSS-REFERENCE TO RELATED APPLICATIONS

This application is based upon and claims the benefit of priority from Japanese Patent Application No. 2012-194544, filed on Sep. 4, 2012; the entire contents of which are incorporated herein by reference.

FIELD

Embodiments described herein relate generally to an imprint apparatus, an imprint method, and a manufacturing method of a semiconductor device.

BACKGROUND

Recently, an imprint method of transferring a template pattern onto a substrate, such as a wafer, attracts attention. In the imprint method, a template on which a template pattern is formed is pressed against resist applied to a substrate and the resist is irradiated with light in the pressed state. Then, the resist is cured by light irradiation, thereby transferring the template pattern onto the resist.

Conventionally, when an application module (dispenser) of resist ejects resist by an inkjet method, the amount of ejection and the dropping positions of resist are controlled with high accuracy with respect to design data on a template pattern.

However, when an underlying pattern itself is distorted, displacement occurs between the underlying pattern and the dropping positions of resist. In such a case, a major filling failure and a protrusion failure of resist may occur in a shot periphery. Then, occurrence of such failures in some cases results in a critical defect in manufacturing semiconductor devices. Therefore, it is desirable that resist is dropped onto an appropriate position with respect to an underlying pattern.

BRIEF DESCRIPTION OF THE DRAWINGS

FIG. 5 is a diagram illustrating a configuration of an imprint apparatus according to a second embodiment;

FIG. 6 is a flowchart illustrating a process procedure of an imprint method according to the second embodiment;

DETAILED DESCRIPTION

According to embodiments, an imprint apparatus is provided. The imprint apparatus includes a stage, a dropping unit, an imprinting unit, an underlying position detecting unit, a correcting unit, and a dropping position control unit. The stage holds a transfer target substrate onto which a circuit pattern formed on a template is transferred and moves the transfer target substrate in a substrate in-plane direction. The dropping unit drops resist onto the transfer target substrate. The imprinting unit holds the template and presses the circuit pattern of the template against the resist on the transfer target substrate. The underlying position detecting unit detects a position of an underlying pattern that is a pattern formed on the transfer target substrate and is a positioning target when the circuit pattern is transferred. The correcting unit corrects a dropping position of the resist on a basis of a position of the underlying pattern. The dropping position control unit causes the resist to be dropped onto a dropping position after correction on the transfer target substrate by controlling at least one of a position of the stage and a position of the dropping unit on a basis of corrected dropping position.

An imprint apparatus, an imprint method, and a manufacturing method of a semiconductor device according to the embodiments will be explained below in detail with reference to the accompanying drawings. The present invention is not limited to these embodiments.

(First Embodiment)

Figure 1:
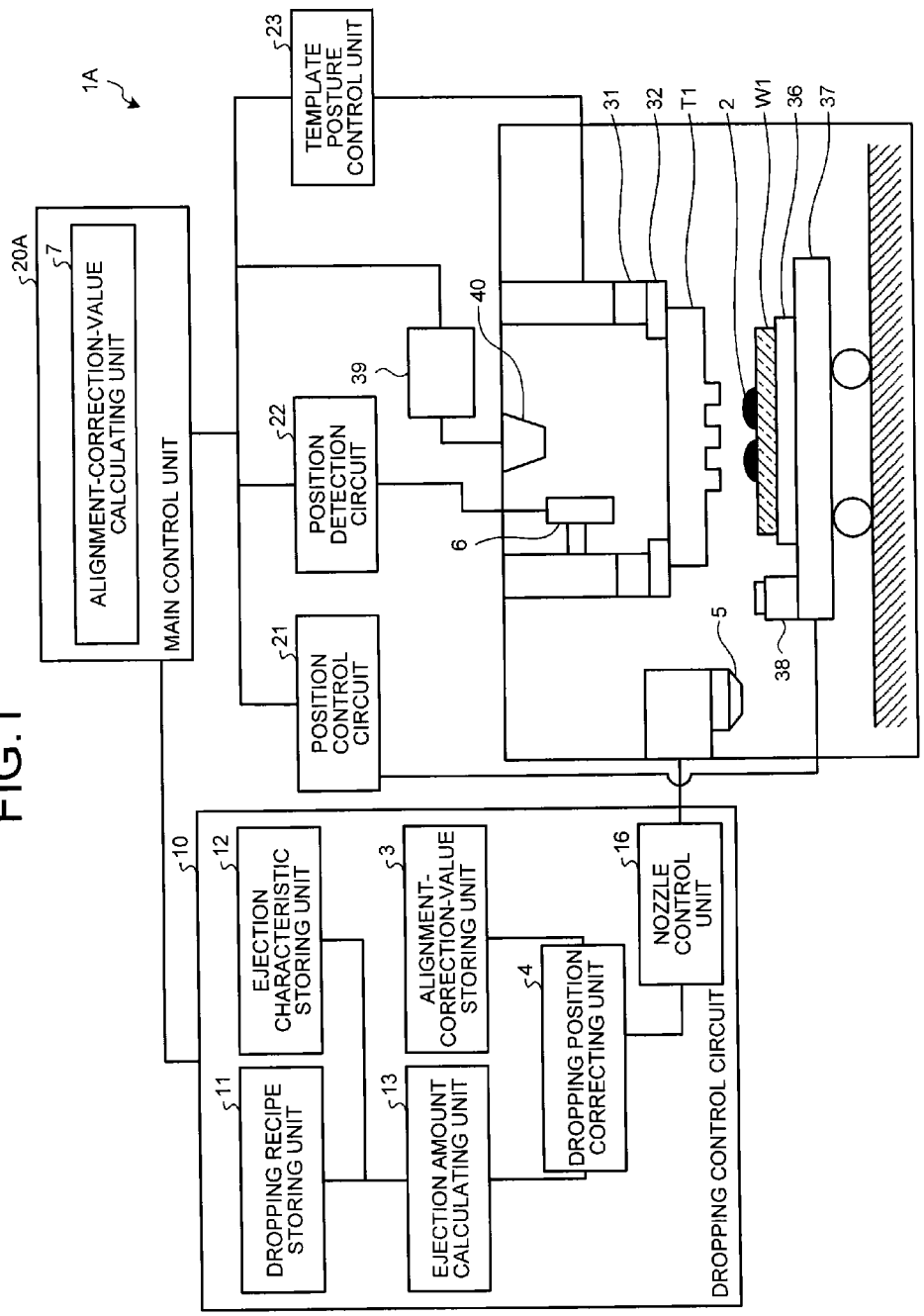
FIG. 1 is a diagram illustrating a configuration of an imprint apparatus according to a first embodiment.

FIG. 1 is a diagram illustrating a configuration of an imprint apparatus according to the first embodiment. An imprint apparatus 1A is an apparatus that performs imprint lithography method (for example, photo nanoimprint method), such as nanoimprint lithography (NIL). The imprint apparatus 1A forms a resist pattern on a transfer target substrate (processing target substrate), such as a wafer W1, by using a template (mold of a master) T1 that is a mold substrate.

The imprint apparatus 1A in the present embodiment sets the dropping positions (arrangement positions) of resist (photocurable organic material) 2 to be dropped onto the wafer W1 on the basis of the distortion of the underlying pattern of the wafer W1. In other words, the imprint apparatus 1A sets the arrangement positions of the resist 2 to predetermined positions on the wafer W1 on the basis of the amount of distortion (amount of displacement) of the underlying pattern that is a positioning target for a resist pattern.

The imprint apparatus 1A drops the resist 2 onto the set dropping positions and transfers a template pattern (such as a circuit pattern) onto the wafer W1 by using a template T1 on which a circuit pattern and the like are formed.

The imprint apparatus 1A includes a control mechanism and an imprint processing mechanism. The control mechanism includes a dropping control circuit 10, a main control unit 20A, a position control circuit 21, a position detection circuit 22, and a template posture control unit 23.

The imprint processing mechanism includes a light source 39, an alignment scope (alignment sensor) 6, a light source irradiation unit 40, a load cell (imprinting unit) 31, a template holding unit 32, a substrate holding unit (substrate chuck) 36, a stage 37, a reference mark base 38, and a nozzle (dispenser) 5 that is a droplet dropping apparatus.

The substrate holding unit 36 is provided above the stage 37. The stage 37 holds the wafer W1 by the substrate holding unit 36 and moves in a plane (in a horizontal plane) parallel to the wafer W1, thereby moving the wafer W1 in an in-plane direction of the wafer W1.

When the resist 2 is dropped onto the wafer W1, the stage 37 moves the wafer W1 to the lower side of the nozzle 5. When the imprinting process is performed on the wafer W1, the stage 37 moves the wafer W1 to the lower side of the template T1 so that the template T1 and the wafer W1 face with other.

Moreover, the reference mark base 38 is provided above the stage 37 and a reference mark is provided on the reference mark base 38. The reference mark is a mark for detecting the position of the stage 37 and is used for alignment when loading the wafer W1 onto the stage 37. The stage 37 has six-axis (x, y, z, θ, α, β) movable directions and moves on a stage surface plate.

The load cell 31 controls the position, the posture, and the like of the template T1 by driving the template holding unit 32. The template holding unit 32 fixes the template T1 from the back surface side (surface on a side on which a template pattern is not formed) of the template T1.

The load cell 31 presses the template pattern of the template T1 against the resist 2 on the wafer W1. The load cell 31 performs pressing of the template T1 against the resist 2 and separation (releasing) of the template T1 from the resist 2 by moving in the up-and-down direction (vertical direction).

The alignment scope 6 is provided on the upper portion side of the load cell 31. The alignment scope 6 is a sensor that detects the positional relationship between the wafer W1 and the template T1. The alignment scope 6 is, for example, composed of a light source, a lens system, and a CCD (Charge Coupled Device) camera.

When the dropping positions of the resist 2 are set, the alignment scope 6 in the present embodiment detects the positions of alignment marks formed on the wafer W1. The alignment mark whose position is detected by the alignment scope 6 is a mark for positioning a resist pattern (overlying pattern) to be formed and is formed by using the underlying pattern.

FIG. 1 illustrates the configuration in which the alignment scope 6 detects the positions of the alignment marks through the template T1, however, the alignment scope 6 may have other configurations.

The light source 39 is provided above the load cell 31 and outputs light (for example, UV (Ultra-Violet-rays) light) with a wavelength that cures the resist 2. The light source 39 is, for example, composed of a high pressure mercury lamp with a wavelength of around 365 nm. The light source irradiation unit 40 emits light from above the template T1 in a state where the template T1 that is a transparent member is pressed against the resist 2.

The resist 2 used in imprinting is photocurable resin that can be cured by being irradiated with light with a specific wavelength. The resist 2 is, for example, UV curable resin that is cured by being irradiated with light with a wavelength of around 365 nm. The resist 2 may be resin having other properties such as a thermosetting property.

The template T1 is a transparent body having a projection and recess pattern (circuit pattern). As a material of the template T1, quartz, sapphire, fluorite, magnesium fluoride, lithium fluoride, or the like is used. Process for releasing by using fluorine-based silane coupling agent or the like may be performed on the projection-and-recess-pattern surface (surface on a side that is pressed against the wafer W1) of the template T1.

The nozzle 5 is an apparatus (application module of organic material) that drops the resist 2 onto an arbitrary position on the wafer W1 by an inkjet method. The ink jet head included in the nozzle 5 includes a plurality of fine holes from which droplets of the resist 2 are ejected. The holes of the nozzle 5 are controlled simultaneously, whereby the resist 2 can be applied (dropped) to desired positions on the wafer W1. The nozzle 5 drops the resist 2 to a predetermined dropping position on the wafer W1 according to an instruction from the dropping control circuit 10.

The main control unit 20A controls the dropping control circuit 10, the position control circuit 21, the position detection circuit 22, and the template posture control unit 23. The main control unit 20A receives output data from each of the dropping control circuit 10, the position control circuit 21, the position detection circuit 22, and the template posture control unit 23, and sends an instruction to each of them.

The position control circuit 21 is a circuit that controls the position of the stage 37. The position control circuit 21 controls the position of the wafer W1 with respect to the nozzle 5 and the position of the wafer W1 with respect to the template T1 by controlling the position of the stage 37. The position control circuit 21 may control the position of the template T1 or the position of the nozzle 5 instead of the stage 37.

The position detection circuit 22 calculates position information (such as the amount of distortion of the underlying pattern) between the wafer W1 and the template T1 by performing the image processing on an image (information on the position of the wafer W1 and the template T1) sent from the alignment scope 6. The position information generated by the position detection circuit 22 is position information on the wafer W1 (underlying pattern) with respect to the template T1. The position detection circuit 22 sends the generated position information to the main control unit 20A.

The main control unit 20A in the present embodiment includes an alignment-correction-value calculating unit 7. The alignment-correction-value calculating unit 7 calculates an alignment correction value of the template T1 with respect to the wafer W1 on the basis of the amount of distortion of the underlying pattern that is already formed on the wafer W1. The alignment correction value is information for correcting the displacement (distortion in the wafer W1 surface) of each imprint shot in the wafer W1 surface and the displacement (distortion in an imprint shot) of a pattern in each imprint shot. The alignment correction value is calculated for each imprint shot.

The alignment-correction-value calculating unit 7 calculates the alignment correction value on the basis of the position information on the underlying pattern sent from the position detection circuit 22 and sends the calculated alignment correction value to the dropping control circuit 10 and the template posture control unit 23.

The template posture control unit 23 is a circuit that controls the position and the posture (distortion) of the template T1. The template posture control unit 23 calculates a pressure applied between the template T1 and the wafer W1 on the basis of a detection signal detected by the load cell 31 and the area of a processed portion on the wafer W1. The template posture control unit 23 distorts the template T1 so that the template T1 conforms to a shot shape of the underlying pattern of the wafer W1 on the basis of the calculated pressure and the alignment correction value calculated by the alignment-correction-value calculating unit 7. The template posture control unit 23 distorts the template T1 to a desired shape by driving a plurality of actuators in the template holding unit 32.

The dropping control circuit 10 includes a dropping recipe storing unit 11, an ejection characteristic storing unit 12, an ejection amount calculating unit 13, an alignment-correction-value storing unit 3, a dropping position correcting unit 4, and a nozzle control unit 16.

The dropping recipe storing unit 11 is, for example, a memory that stores a dropping recipe. The dropping recipe includes the timing at which the resist 2 is dropped (ejected), the dropping positions, and the like. The dropping recipe is, for example, generated on the basis of design data (layout pattern data) corresponding to a resist pattern (template pattern). The dropping recipe may be generated by the imprint apparatus 1A or an apparatus other than the imprint apparatus 1A.

The ejection characteristic storing unit 12 is, for example, a memory that stores the ejection characteristics of the nozzle 5 when the nozzle 5 ejects the resist 2. The ejection characteristics of the nozzle 5 include the number of fine holes provided in the ink jet head, the ejection speed from the fine holes, and the like. When the imprint apparatus 1A includes a plurality of the nozzles 5, the ejection characteristic storing unit 12 stores the ejection characteristics for each nozzle 5. The ejection characteristics of the nozzle 5 may be, for example, input to the ejection characteristic storing unit 12 from the imprint apparatus 1A or input to the ejection characteristic storing unit 12 from an apparatus other than the imprint apparatus 1A.

The ejection amount calculating unit 13 calculates the amount of ejection of the resist 2 ejected from the nozzle 5 on the basis of the dropping recipe stored in the dropping recipe storing unit 11 and the ejection characteristics of the nozzle 5 stored in the ejection characteristic storing unit 12. The ejection amount calculating unit 13 calculates the amount of the resist 2 necessary for forming a resist pattern as the amount of ejection of the resist 2 (appropriate amount of ejection). The ejection amount calculating unit 13 sends the calculated amount of ejection and the dropping recipe to the dropping position correcting unit 4. The alignment-correction-value storing unit 3 is, for example, a memory that stores the alignment correction value sent from the alignment-correction-value calculating unit 7.

The dropping position correcting unit 4 corrects the dropping positions of the resist 2 set in the dropping recipe on the basis of the amount of ejection calculated by the ejection amount calculating unit 13 and the alignment correction value stored in the alignment-correction-value storing unit 3. The dropping position correcting unit 4 corrects the dropping positions of the resist 2 so that the resist 2 is dropped onto the positions corresponding to the alignment correction value while maintaining the amount of ejection of the resist 2 calculated by the ejection amount calculating unit 13. The dropping position correcting unit 4 sends the dropping recipe in which the dropping positions of the resist 2 are corrected to the nozzle control unit 16.

In this manner, the imprint apparatus 1A in the present embodiment includes the dropping position correcting unit 4 and the alignment-correction-value storing unit 3 for correcting the dropping positions of the resist 2 in the dropping control circuit 10 for dropping the resist 2 onto the dropping positions corresponding to the shot distortion of the underlying pattern.

The nozzle control unit 16 controls the movement position, the driving posture, and the like of the nozzle 5 by using the dropping recipe corrected by the dropping position correcting unit 4. Because the dropping recipe is corrected on the basis of the distortion of the underlying pattern of the wafer W1, the nozzle 5 performs an operation according to the distortion of the underlying pattern to correct the distortion of the underlying pattern of the wafer W1. In this manner, the nozzle 5 is controlled so that the resist 2 is arranged at appropriate positions with respect to the underlying pattern.

Figure 2:
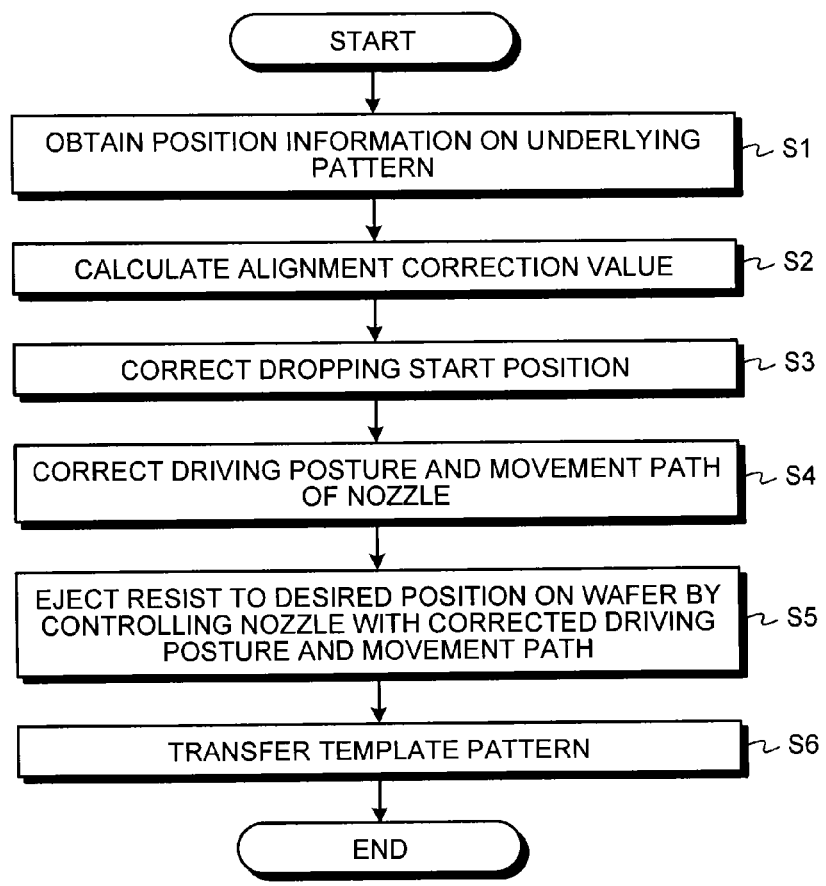
FIG. 2 is a flowchart illustrating a process procedure of an imprint method according to the first embodiment.

FIG. 2 is a flowchart illustrating a process procedure of an imprint method according to the first embodiment. The imprint method according to the first embodiment performs a process of correcting the dropping positions of the resist 2 by using the position information on the underlying pattern.

The underlying pattern is formed in advance on the wafer W1. The underlying pattern of the wafer W1 is, for example, formed by using the imprint apparatus 1A. When a resist pattern (overlying pattern) is formed on the underlying pattern of the wafer W1, the wafer W1 is carried into the imprint apparatus 1A.

The imprint apparatus 1A places the wafer W1 on the stage 37 and holds the wafer W1 by the substrate holding unit 36. Then, the imprint apparatus 1A performs alignment of the wafer W1 by using the reference mark on the reference mark base 38 and the alignment scope 6.

Furthermore, the imprint apparatus 1A performs positioning between the wafer W1 and the template T1 by using the alignment scope 6. Specifically, the alignment scope 6 detects the positions of the alignment marks formed on the wafer W1.

Figure 3:
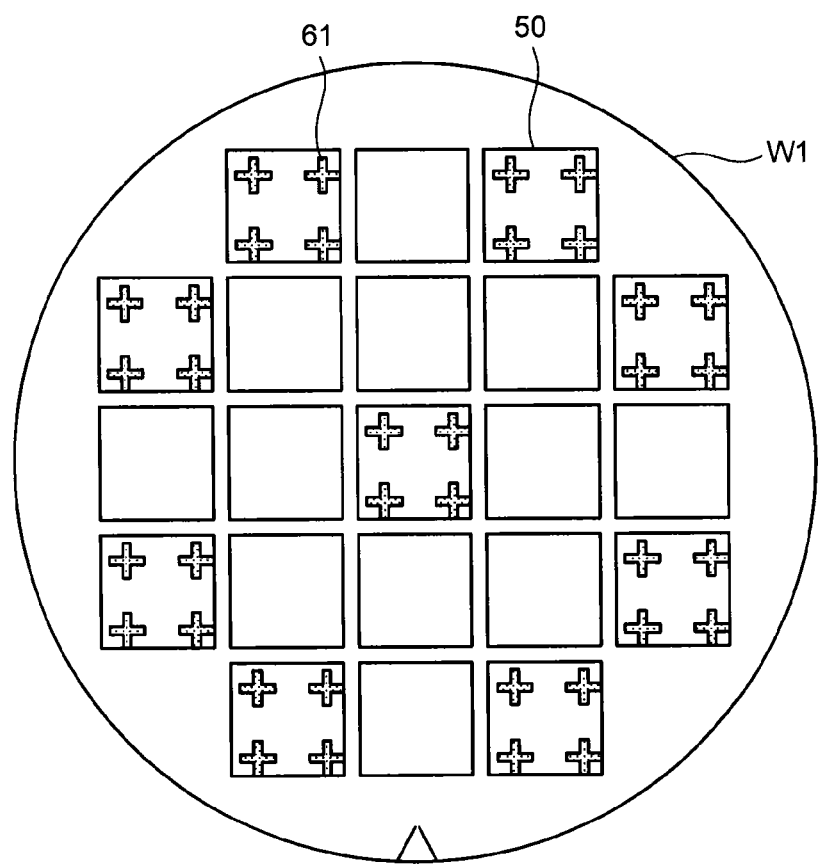
FIG. 3 is a diagram for explaining a shot in which positions of alignment marks are detected.

FIG. 3 is a diagram for explaining a shot in which the positions of the alignment marks are detected. A plurality of imprint shots 50 is arranged in the wafer W1 and a plurality of alignment marks 61 is formed in each imprint shot 50. For convenience sake of explanation, FIG. 3 is illustrated such that the alignment mark 61 is not arranged in some imprint shots 50, however, practically, the alignment marks 61 are arranged on all the imprint shots 50 in the same manner.

The alignment scope 6, for example, performs position detection of the alignment marks on a predetermined shot in the wafer W1. In other words, the alignment scope 6 does not perform position detection on the alignment marks in all the shots and performs position detection only on a predetermined shot.

The alignment scope 6 may perform position detection on the alignment marks in all the shots. Moreover, the number of alignment marks formed in each shot is not limited to four and may be three or less or five or more.

The position detection circuit 22 calculates the position information (position information on the underlying pattern) between the wafer W1 and the template T1 by performing the image processing on an image sent from the alignment scope 6. The position detection circuit 22 sends the generated position information to the alignment-correction-value calculating unit 7. Consequently, the alignment-correction-value calculating unit 7 obtains the position information on the underlying pattern (Step S1).

The alignment-correction-value calculating unit 7 calculates the alignment correction value on the basis of the position information on the underlying pattern sent from the position detection circuit 22 (Step S2). The alignment-correction-value calculating unit 7 approximately calculates information (alignment correction value) on the shot distortion of the underlying pattern by using a polynomial optimized by a least-square method or the like with respect to the position information on the underlying pattern detected from the predetermined shot.

In this calculation method, each of a shot arrangement (grid) and a shot shape (shot distortion) in the wafer W1 is represented in the form of a polynomial for deriving coordinate information. Consequently, each shot coordinate on the wafer W1 is represented by the polynomial.

When the alignment correction value is calculated, a polynomial representing the above-described alignment correction value or shot coordinates on the wafer W1 is calculated from the position information on the underlying pattern. In the present embodiment, the alignment correction value is calculated by obtaining the coefficients in the polynomials in Equations (1) to (4) below.

$$DX = K_1 + K_3 \times X + K_5 \times Y + K_7 \times X^2 + K_9 \times XY + K_{11} \times Y^2 + K_{13} \times X^3 + K_{15} \times X^2 Y + K_{17} \times XY^2 + K_{19} \times Y^3 \quad (1)$$

$$DY = K_2 + K_4 \times Y + K_6 \times X + K_8 \times Y^2 + K_{10} \times YX + K_{12} \times X^2 + K_{14} \times Y^3 + K_{16} \times Y^2 X + K_{18} \times YX^2 + K_{20} \times X^3 \quad (2)$$

$$dx = k_1 + k_3 \times x + k_5 \times y + k_7 \times x^2 + k_9 \times xy + k_{11} \times y^2 + k_{13} \times x^3 + k_{15} \times x^2 y + k_{17} \times xy^2 + k_{19} \times y^3 \quad (3)$$

$$dy = k_2 + k_4 \times y + k_6 \times x + k_8 \times y^2 + k_{10} \times yx + k_{12} \times x^2 + k_{14} \times y^3 + k_{16} \times y^2 x + k_{18} \times yx^2 + k_{20} \times x^3 \quad (4)$$

(DX, DY) in this embodiment represent polynomials for calculating the amount of displacement of a shot position and (X, Y) in the polynomials (DX, DY) represent shot-position initial coordinates on the wafer W1 surface. The shot-position initial coordinates are an initial position (position at which the resist 2 is dropped first) of each shot.

Moreover, (dx, dy) represent the amount of displacement at each point in a shot and (x, y) in the polynomials (dx, dy) represent ideal coordinates in a shot. Obtaining coefficients K and coefficients k in the above-described Equations (1) to (4) is equivalent to obtaining a correction value of a shot position and a shot shape. Various methods are already known for alignment and calculating an overlay correction value in a semiconductor manufacturing process and therefore detailed explanation thereof is not described here.

Equations (1) to (4) in this embodiment each include up to a third order component, however, it is possible to calculate only a linear component by detecting the alignment marks and use a coefficient fed back from a result of an overlay measurement, which is separately performed in advance, for high order components. Moreover, the alignment correction value may be calculated by using only a linear component. Furthermore, a grid and a shot shape can be corrected by using a higher order polynomial by using a method such as feedback of an overlay measurement result.

The alignment-correction-value calculating unit 7 sends the calculated alignment correction value to the dropping control circuit 10 and the template posture control unit 23. The template posture control unit 23 distorts the template T1 on the basis of the pressure applied between the template T1 and the wafer W1 and the alignment correction value. The dropping control circuit 10 stores the alignment correction value sent from the alignment-correction-value calculating unit 7 in the alignment-correction-value storing unit 3.

The dropping position correcting unit 4 corrects the dropping positions of the resist 2 set in the dropping recipe on the basis of the amount of ejection of the resist 2 calculated by the ejection amount calculating unit 13 and the alignment correction value stored in the alignment-correction-value storing unit 3.

Specifically, the dropping position correcting unit 4 corrects the position coordinates of each shot in the wafer W1 surface by using the alignment correction value. Consequently, the driving start position (dropping start position) of the nozzle 5 (dispenser) is corrected from the preset start position (Step S3).

Figure 4A:
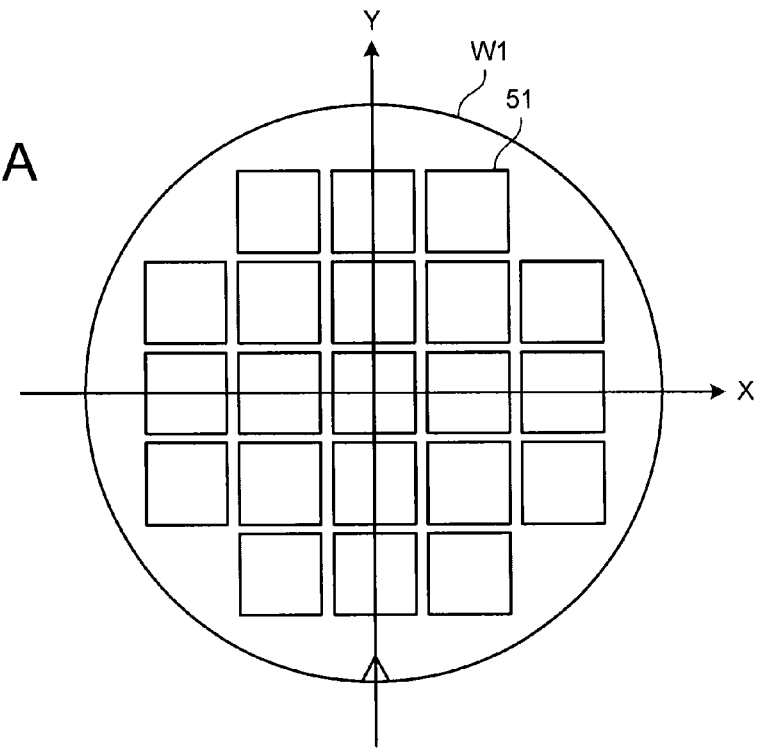
FIG. 4A and FIG. 4B are diagrams for explaining a dropping start position of resist.
Figure 4B:
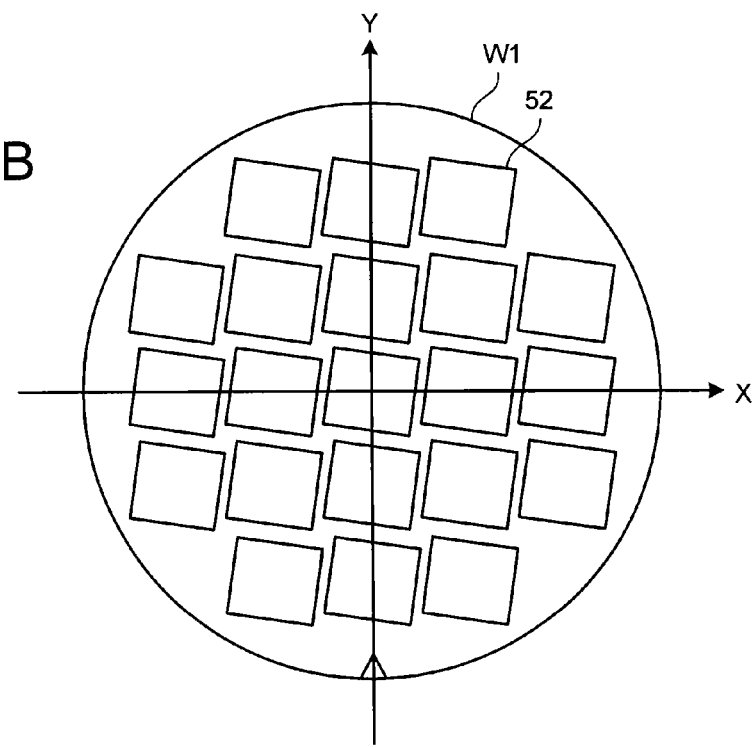

FIG. 4A and FIG. 4B are diagrams for explaining the dropping start position of resist. FIG. 4A and FIG. 4B illustrate the arrangement positions of imprint shots set in the wafer W1. FIG. 4A illustrates the arrangement positions of imprint shots 51 before performing alignment correction on the underlying pattern and FIG. 4B illustrates the arrangement positions of imprint shots 52 after performing alignment correction on the underlying pattern.

Before performing alignment correction on the underlying pattern, the imprint shots 51 are regularly arranged at equal intervals in the X direction and the Y direction. Specifically, the imprint shots are arranged in a lattice pattern so that the side of each imprint shot extending in the horizontal direction is parallel to the X direction and the side of each imprint shot extending in the vertical direction is parallel to the Y direction.

The position of each imprint shot 51 is corrected to a position (position of the imprint shot 52) according to the alignment correction value by performing alignment correction on the underlying pattern. Consequently, the dropping start position, which is the driving start position of the nozzle 5, is corrected from the preset start position.

Furthermore, the dropping position correcting unit 4 corrects the driving posture and the movement path of the nozzle 5 so that the dropping positions of the resist 2 correspond to a shot distorted shape by using the alignment correction value (Step S4).

At this time, the dropping position correcting unit 4 obtains the distorted shape in a shot from numerical values of linear components ($k3$, $k4$, $k5$, $k6$, $k9$, and $k10$) indicative of the distortion in a shot and corrects the driving posture and the movement path in each shot of the nozzle 5 to correspond to the distorted shape. The dropping position correcting unit 4 sends the dropping recipe in which the dropping positions of the resist 2 are corrected to the nozzle control unit 16.

The nozzle control unit 16 controls the movement position, the movement path, and the like of the nozzle 5 by using the dropping recipe corrected by the dropping position correcting unit 4. Consequently, the nozzle 5 ejects the resist 2 to desired positions on the wafer W1 according to the dropping recipe in which the dropping positions are corrected (Step S5). Because the driving posture and the movement path of the nozzle 5 are corrected, the resist 2 ejected from the nozzle 5 is ejected to reproduce the linear components indicative of a shot distortion.

Thereafter, the imprint apparatus 1A presses (imprints) the template T1 against the resist 2 on the wafer W1, whereby filling of the template pattern with the resist 2 is performed. When the template T1 formed by engraving the template pattern is brought into contact with the resist 2, the resist 2 flows into the template pattern by capillary action. Then, when filling of the template pattern with the resist 2 is completed, the light source irradiation unit 40 emits light from above the template T1.

Consequently, the resist 2 is cured. After the resist 2 is cured, the imprint apparatus 1A releases the template T1 from the resist 2. Consequently, a resist pattern having the inverse shape of the template pattern is formed (transferred) on the wafer W1 (Step S6). Thereafter, the imprint apparatus 1A unloads the wafer W1.

The correction process of the dropping positions and the imprinting process by using the imprint apparatus 1A are performed, for example, for each layer of a wafer process. Specifically, design data is generated for each resist pattern to be formed on the wafer W1 and a template pattern in accordance with each design data is generated. Then, the template T1 having the template pattern is formed.

The imprint apparatus 1A performs the correction process of the dropping positions for each design data. Then, the imprint apparatus 1A causes the resist 2 to be dropped onto the wafer W1 by using the dropping recipe in which the dropping positions are corrected. Moreover, the imprint apparatus 1A forms a resist pattern on the wafer W1 by using the template T1. The lower layer side of the wafer W1 is processed (for example, etched) with this resist pattern as a mask. When manufacturing a semiconductor device (semiconductor integrated circuit), the correction process of the dropping positions, the imprinting process, the processing process from above a resist pattern, and the like are repeated for each layer in the wafer process.

In the present embodiment, the resist 2 is dropped onto the positions according to the underlying pattern by controlling the position of the nozzle 5 by the nozzle control unit 16, however, the resist 2 may be dropped onto the positions according to the underlying pattern by controlling the position of the stage 37 by the position control circuit 21. In this case, the dropping position correcting unit 4 sends information on the dropping positions of the resist 2 to the position control circuit 21. Moreover, the resist 2 may be dropped onto the positions according to the underlying pattern by performing both the position control of the nozzle 5 by the nozzle control unit 16 and the position control of the stage 37 by the position control circuit 21.

In this manner, according to the first embodiment, because the dropping positions of the resist 2 are corrected on the basis of the distortion of the underlying pattern of the wafer W1, resist can be dropped onto appropriate positions with respect to the underlying pattern. Consequently, the displacement that occurs between the imprint position of the template T1 and the dropping positions of the resist 2 can be prevented, therefore, a filling failure in the imprinting process and a protrusion failure of the resist 2 can be prevented.

(Second Embodiment)

Next, the second embodiment of this invention will be explained with reference to FIG. 5 to FIG. 8. In the second embodiment, an ejection area shape (dropping field shape to be described later) of the resist 2 is corrected by using the alignment correction value and the dropping recipe is generated on the basis of the corrected dropping field shape.

FIG. 5 is a diagram illustrating a configuration of an imprint apparatus according to the second embodiment. Among the components in FIG. 5, components that achieve the same function as the imprint apparatus 1A in the first embodiment shown in FIG. 1 are denoted by the same reference numerals and overlapping explanation is omitted.

An imprint apparatus 1B includes a main control unit 20B instead of the main control unit 20A compared with the imprint apparatus 1A. In other words, the control mechanism of the imprint apparatus 1B includes the dropping control circuit 10, the main control unit 20B, the position control circuit 21, the position detection circuit 22, and the template posture control unit 23.

The main control unit 20B includes the alignment-correction-value calculating unit 7, a shot shape setting unit 8, and a dropping recipe generating unit 9. The shot shape setting unit 8 corrects an area (dropping field shape) in which the resist 2 is ejected by using the alignment correction value calculated by the alignment-correction-value calculating unit 7. The dropping field shape is a shot shape on the wafer W1 onto which the resist 2 is dropped and is corrected for each shot on the basis of the alignment correction value.

The shot shape setting unit 8 corrects the dropping field shape by correcting design data on an overlying pattern on the basis of the alignment correction value (distortion of the underlying pattern). The shape setting unit 8 corrects the dropping field shape by correcting the dropping field shape so that the resist 2 can be dropped onto the positions according to the distortion of the underlying pattern. The shot shape setting unit 8 sends the corrected dropping field shape to the dropping recipe generating unit 9.

The dropping recipe generating unit 9 generates the dropping recipe of the resist 2 on the basis of the dropping field shape. The dropping field shape is, for example, set according to design data on an overlying pattern. In the present embodiment, because the dropping field shape is corrected to correct design data of an overlying pattern on the basis of the alignment correction value, the dropping field shape is corrected to an area according to the distortion of the underlying pattern. The dropping recipe generating unit 9 sends the generated dropping recipe to the dropping recipe storing unit 11 of the dropping control circuit 10. The ejection amount calculating unit 13 in the present embodiment calculates the amount of ejection of the resist 2 by using the dropping recipe generated by the dropping recipe generating unit 9.

FIG. 6 is a flowchart illustrating a process procedure of an imprint method according to the second embodiment. The imprint method according to the second embodiment corrects the dropping positions of the resist 2 by using the position information on the underlying pattern and generates the dropping recipe by using the position information on the underlying pattern. Explanation of a process similar to the process in the imprint method according to the first embodiment is omitted.

After the wafer W1 is carried into the imprint apparatus 1B, the position detection circuit 22 calculates the position information (position information on the underlying pattern) between the wafer W1 and the template T1 by performing the image processing on an image sent from the alignment scope 6. The position detection circuit 22 sends the generated position information to the alignment-correction-value calculating unit 7. Consequently, the alignment-correction-value calculating unit 7 obtains the position information on the underlying pattern (Step S11).

The alignment-correction-value calculating unit 7 calculates the alignment correction value on the basis of the position information on the underlying pattern sent from the position detection circuit 22 (Step S12). The processes in Steps S11 and S12 are processes similar to the processes in Steps S1 and S2 in the first embodiment.

The alignment-correction-value calculating unit 7 sends the calculated alignment correction value to the dropping control circuit 10, the template posture control unit 23, and the shot shape setting unit 8. The shot shape setting unit 8 corrects the dropping field shape on the basis of the alignment correction value. In other words, the shot shape setting unit 8 corrects the dropping field shape set with respect to design data on an overlying pattern on the basis of the distortion of the underlying pattern. Consequently, the dropping field shape according to the distortion of the underlying pattern is corrected (Step S13).

The correcting process of the dropping field shape is performed by converting coordinates of each point in a shot to a position according to the distortion by using coefficients indicating the distortion of the shot (dropping field shape). The coefficients used in this embodiment correspond to the coefficients in Equations (1) to (4) used in the first embodiment and coefficients up to a necessary order can be used for correcting coordinates when correcting the dropping field shape. The order for correcting the distortion in the imprint apparatus 1B is limited, therefore, it is desirable that the order is made to coincide with the order used when correcting the dropping field shape. The shot shape setting unit 8 sends the corrected dropping field shape to the dropping recipe generating unit 9.

The dropping recipe generating unit 9 generates the dropping recipe appropriate for the dropping field shape on the basis of the corrected dropping field shape (Step S14). In other words, the dropping recipe generating unit 9 regenerates the dropping recipe by using the corrected shot coordinates. Specifically, the dropping recipe generating unit 9 regenerates the dropping recipe by converting the position coordinates of design data on the template pattern to those in the corrected coordinate system. In terms of a dropping recipe generating method, the method described, for example, in Japanese Patent Laid-open Publication 2012-69818 or Japanese Patent Laid-open Publication 2012-69701 is applied. Consequently, the dropping recipe according to the distortion of the underlying pattern is generated. The dropping recipe generating unit 9 sends the generated dropping recipe to the dropping recipe storing unit 11 of the dropping control circuit 10.

Figure 7A:
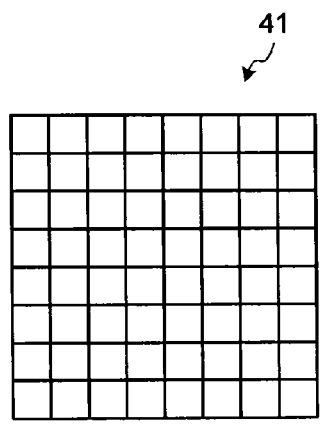
FIG. 7A to FIG. 7C are diagrams for explaining a dropping field shape and dropping positions.
Figure 7B:
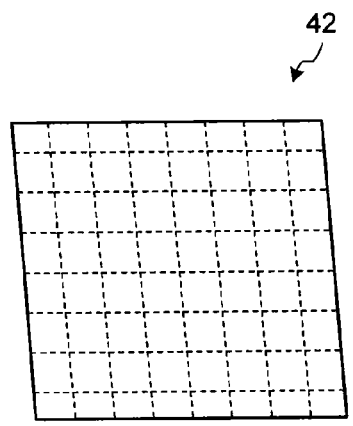
Figure 7C:
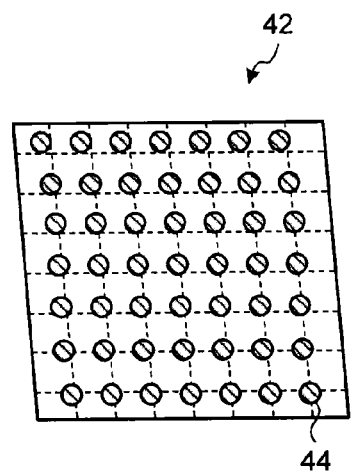

FIG. 7A to FIG. 7C are diagrams for explaining the dropping field shape and the dropping positions. FIG. 7A illustrates a dropping field shape 41 before correcting and FIG. 7B illustrates a corrected dropping field shape 42. FIG. 7C illustrates the dropping positions of the resist 2 set in the corrected dropping field shape 42.

The dropping field shape 41 before correcting is a rectangle and the coordinates in the dropping field shape 41 are arranged at equal intervals. The corrected dropping field shape 42 is, for example, a shape formed by distorting the rectangle of the dropping field shape 41. The coordinates in the corrected dropping field shape 42 are not arranged at equal intervals and coordinates according to the distortion of the underlying pattern are set.

In the dropping recipe used in the corrected dropping field shape 42, dropping positions 44 of the resist 2 are set. Because the dropping positions 44 become positions according to the coordinates in the dropping field shape 42, the dropping positions 44 become positions according to the distortion of the underlying pattern. In other words, the dropping positions 44 become positions at which a distortion component of a shot is corrected. In this manner, the resist 2 is dropped onto the dropping positions according to the distortion of the underlying pattern.

The ejection amount calculating unit 13 calculates the amount of ejection of the resist 2 by using the dropping recipe generated by the dropping recipe generating unit 9. Furthermore, the dropping position correcting unit 4 corrects the dropping positions of the resist 2 set in the dropping recipe on the basis of the amount of ejection of the resist 2 and the alignment correction value.

Specifically, the dropping position correcting unit 4 corrects position coordinates of each shot in the wafer W1 surface by using the alignment correction value. Consequently, the dropping start position of the resist 2 is corrected from the preset start position (Step S15).

Furthermore, the dropping position correcting unit 4 corrects the driving posture and the movement path of the nozzle 5 so that the dropping positions of the resist 2 correspond to a shot distorted shape by using the alignment correction value (Step S16). The dropping position correcting unit 4 sends the dropping recipe in which the dropping positions of the resist 2 are corrected to the nozzle control unit 16.

Consequently, the nozzle control unit 16 controls the nozzle 5 by using the dropping recipe generated by the dropping recipe generating unit 9 and corrected by the dropping position correcting unit 4 and ejects the resist 2 to desired positions on the wafer W1 (Step S17). At this time, the nozzle control unit 16 controls the movement position, the driving posture, and the like of the nozzle 5 by using the dropping recipe.

Thereafter, the imprint apparatus 1B presses the template T1 against the resist 2, thereby filling the template pattern with the resist 2. Then, when filling of the template pattern with the resist 2 is completed, the light source irradiation unit 40 emits light from above the template T1 to cure the resist 2.

After the resist 2 is cured, the imprint apparatus 1B releases the template T1 from the resist 2. Consequently, a resist pattern having the inverse shape of the template pattern is transferred (Step S18).

Next, a hardware configuration of the control mechanism included in the imprint apparatuses 1A and 1B will be explained. In this embodiment, the control mechanism included in the imprint apparatus 1A and the control mechanism included in the imprint apparatus 1B have a similar hardware configuration, therefore, the hardware configuration of the control mechanism included in the imprint apparatus 1B is explained.

Figure 8:
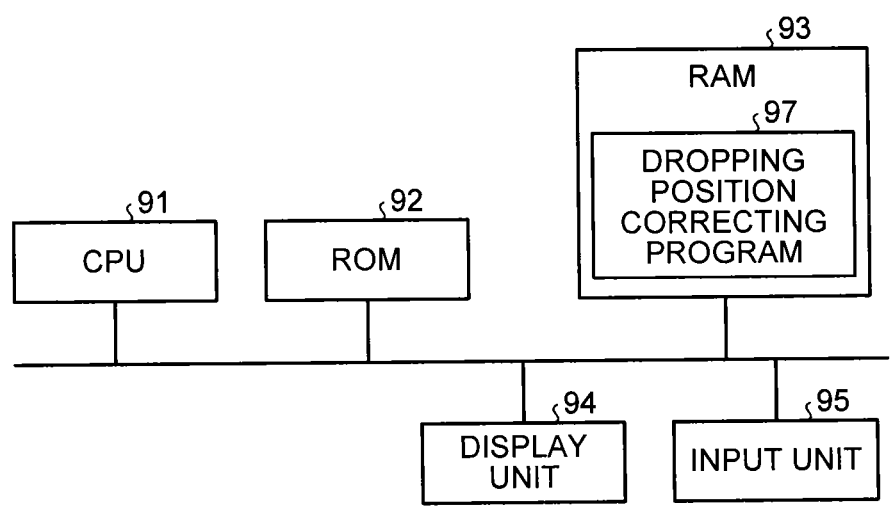
FIG. 8 is a diagram illustrating a hardware configuration of a control mechanism.

FIG. 8 is a diagram illustrating a hardware configuration of the control mechanism. The control mechanism includes a CPU (Central Processing Unit) 91, a ROM (Read Only Memory) 92, a RAM (Random Access Memory) 93, a display unit 94, and an input unit 95. In the control mechanism, the CPU 91, the ROM 92, the RAM 93, the display unit 94, and the input unit 95 are connected via a bus line.

The CPU 91 corrects a resist dropping position by using a dropping position correcting program 97 that is a computer program. The dropping position correcting program 97 is a computer program product that is executable in a computer and includes a non-transitory computer readable recording medium including a plurality of instructions for correcting a dropping position. In the dropping position correcting program 97, the instructions cause the computer to execute the correction process of a dropping position.

The display unit 94 is a display apparatus, such as a liquid crystal monitor, and displays the position of the underlying pattern (coordinates of the alignment mark), the alignment correction value, the dropping field shape, the dropping recipe, the ejection characteristics, the amount of ejection, the dropping position after correction, and the like on the basis of an instruction from the CPU 91.

The input unit 95 includes a mouse and a keyboard, and inputs instruction information (such as parameter necessary for correcting a resist dropping position) that is externally input by a user. The instruction information input to the input unit 95 is sent to the CPU 91.

The dropping position correcting program 97 is stored in the ROM 92 and is loaded in the RAM 93 via the bus line. FIG. 8 illustrates a state where the dropping position correcting program 97 is loaded in the RAM 93.

The CPU 91 executes the dropping position correcting program 97 loaded in the RAM 93. Specifically, in the control mechanism, the CPU 91 reads the dropping position correcting program 97 from the ROM 92, loads it in a program storage area in the RAM 93, and executes various processes, in accordance with the input of an instruction by a user from the input unit 95. The CPU 91 temporarily stores various data generated in the various processes in a data storage area formed in the RAM 93.

The dropping position correcting program 97 executed in the control mechanism has a module configuration including the alignment-correction-value calculating unit 7, the shot shape setting unit 8, the dropping recipe generating unit 9, the ejection amount calculating unit 13, and the dropping position correcting unit 4, and these are loaded in a main storage device to be generated on the main storage device.

In this manner, according to the second embodiment, because the dropping recipe is generated on the basis of the distortion of the underlying pattern of the wafer W1, resist can be dropped onto a position appropriate for the underlying pattern.

In this manner, according to the first and second embodiments, resist can be dropped onto a position appropriate for the underlying pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint method comprising:
placing a transfer target substrate onto which a circuit pattern formed on a template is transferred on a stage;
detecting a position of an underlying pattern that is a pattern formed on the transfer target substrate and is a positioning target when the circuit pattern is transferred;
calculating an amount of distortion of the underlying pattern on a basis of the position of the underlying pattern;
correcting a dropping field shape that is a shape of an area in which resist is dropped by correcting design data on the circuit pattern on a basis of the amount of distortion;
correcting a dropping position of the resist by setting the dropping position of the resist at a position corresponding to the dropping field shape;
dropping the resist onto the corrected dropping position of the resist on the transfer target substrate; and
pressing the circuit pattern of the template against the resist on the transfer target substrate.

2. The imprint method according to claim 1, further comprising calculating an alignment correction value for correcting an amount of displacement between the circuit pattern and the underlying pattern on a basis of the position of the underlying pattern, wherein
the dropping position of the resist is corrected by using the alignment correction value.

3. The imprint method according to claim 2, wherein when the circuit pattern of the template is pressed against the resist on the transfer target substrate, the amount of displacement between the circuit pattern and the underlying pattern is corrected by controlling a posture of the template by using the alignment correction value.

4. The imprint method according to claim 2, further comprising generating a dropping recipe of the resist on a basis of the alignment correction value, wherein
the dropping recipe is corrected by correcting the dropping position of the resist, and
the resist is dropped onto the corrected dropping position of the resist on the transfer target substrate by using the corrected dropping recipe.

5. The imprint method according to claim 4, further comprising correcting the dropping field shape by correcting the design data on the circuit pattern on a basis of the alignment correction value, wherein
the dropping recipe is generated by using the dropping field shape.

6. The imprint method according to claim 2, wherein
the amount of distortion of the underlying pattern is detected by detecting a position of an alignment mark formed in the underlying pattern, and
a polynomial representing the alignment correction value is calculated by using the amount of distortion, and the alignment correction value is calculated by obtaining a coefficient of the polynomial.

7. The imprint method according to claim 1, wherein a position to start dropping the resist and a movement path, with respect to the transfer target substrate, of a dropping unit, that drops the resist onto the transfer target substrate, are corrected for each imprint shot as the dropping position of the resist.

8. A manufacturing method of a semiconductor device comprising:
placing a transfer target substrate onto which a circuit pattern formed on a template is transferred on a stage;
detecting a position of an underlying pattern that is a pattern formed on the transfer target substrate and is a positioning target when the circuit pattern is transferred;
calculating an amount of distortion of the underlying pattern on a basis of the position of the underlying pattern;
correcting a dropping field shape that is a shape of an area in which resist is dropped by correcting design data on the circuit pattern on a basis of the amount of distortion;
correcting a dropping position of the resist by setting the dropping position of the resist at a position corresponding to the dropping field shape;
dropping the resist onto the corrected dropping position of the resist on the transfer target substrate;
transferring the circuit pattern onto the transfer target substrate by causing the resist to be cured in a state where the circuit pattern of the template is pressed against the resist on the transfer target substrate and separating the template from the cured resist; and
processing a lower layer side of the transfer target substrate with the cured resist as a mask.

9. The manufacturing method of the semiconductor device according to claim 8, further comprising calculating an alignment correction value for correcting an amount of displacement between the circuit pattern and the underlying pattern on a basis of the position of the underlying pattern, wherein
the dropping position of the resist is corrected by using the alignment correction value.

10. The manufacturing method of the semiconductor device according to claim 9, wherein, when the circuit pattern of the template is pressed against the resist on the transfer target substrate, the amount of displacement between the circuit pattern and the underlying pattern is corrected by controlling a posture of the template by using the alignment correction value.

11. The manufacturing method of the semiconductor device according to claim 9, further comprising generating a dropping recipe of the resist on a basis of the alignment correction value, wherein
the dropping recipe is corrected by correcting the dropping position of the resist, and
the resist is dropped onto the corrected dropping position of the resist on the transfer target substrate by using the corrected dropping recipe.

12. The manufacturing method of the semiconductor device according to claim 11, further comprising correcting the dropping field shape by correcting the design data on the circuit pattern on a basis of the alignment correction value, wherein
the dropping recipe is generated by using the dropping field shape.

13. The manufacturing method of the semiconductor device according to claim 9, wherein
the amount of distortion of the underlying pattern is detected by detecting a position of an alignment mark formed in the underlying pattern, and
a polynomial representing the alignment correction value is calculated by using the amount of distortion, and the alignment correction value is calculated by obtaining a coefficient of the polynomial.

14. An imprint method comprising:
placing a transfer target substrate onto which a circuit pattern formed on a template is transferred on a stage;
detecting a position of an underlying pattern that is a pattern formed on the transfer target substrate and is a positioning target when the circuit pattern is transferred;

calculating an amount of distortion of the underlying pattern on a basis of the position of the underlying pattern;

calculating a polynomial representing an alignment correction value for correcting an amount of displacement between the circuit pattern and the underlying pattern by using the amount of distortion;

calculating the alignment correction value by obtaining a coefficient of the polynomial;

correcting a dropping position of resist on a basis of the alignment correction value;

dropping the resist onto the corrected dropping position of the resist on the transfer target substrate; and pressing the circuit pattern of the template against the resist on the transfer target substrate.

15. A manufacturing method of a semiconductor device comprising:

placing a transfer target substrate onto which a circuit pattern formed on a template is transferred on a stage;

detecting a position of an underlying pattern that is a pattern formed on the transfer target substrate and is a positioning target when the circuit pattern is transferred;

calculating an amount of distortion of the underlying pattern on a basis of the position of the underlying pattern;

calculating a polynomial representing an alignment correction value for correcting an amount of displacement between the circuit pattern and the underlying pattern by using the amount of distortion;

calculating the alignment correction value by obtaining a coefficient of the polynomial;

correcting a dropping position of resist on a basis of the alignment correction value;

dropping the resist onto the corrected dropping position of the resist on the transfer target substrate;

transferring the circuit pattern onto the transfer target substrate by causing the resist to be cured in a state where the circuit pattern of the template is pressed against the resist on the transfer target substrate and separating the template from the cured resist; and processing a lower layer side of the transfer target substrate with the cured resist as a mask.

* * * * *